United States Patent
Miyagawa

(10) Patent No.: US 7,986,035 B2
(45) Date of Patent: Jul. 26, 2011

(54) MULTILAYER WIRING SUBSTRATE, SEMICONDUCTOR PACKAGE, AND METHOD OF MANUFACTURING SEMICONDUCTOR PACKAGE

(75) Inventor: Yuichi Miyagawa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 69 days.

(21) Appl. No.: 12/382,546

(22) Filed: Mar. 18, 2009

(65) Prior Publication Data

US 2009/0250802 A1  Oct. 8, 2009

(30) Foreign Application Priority Data

Apr. 4, 2008  (JP) ................. 2008-097815

(51) Int. Cl.
*H01L 23/02* (2006.01)

(52) U.S. Cl. ................. 257/690; 257/691; 257/E21.499

(58) Field of Classification Search .................. 257/690, 257/E23.01, E23.18, 691, 782, E21.499; 438/124

See application file for complete search history.

(56) References Cited

U.S. PATENT DOCUMENTS 7,498,522 B2   3/2009  Itoh

FOREIGN PATENT DOCUMENTS

| | | |
|---|---|---|
| CN | 101014225 A | 8/2007 |
| JP | 10-294560 | 11/1998 |
| JP | 2001-217514 | 8/2001 |
| JP | 2004-281924 | 10/2004 |
| JP | 2005-038906 | 2/2005 |
| JP | 2007-207781 | 8/2007 |

*Primary Examiner* — Roy K Potter

(74) *Attorney, Agent, or Firm* — McGinn IP Law Group, PLLC

(57) ABSTRACT

A multilayer wiring substrate included in the semiconductor package includes: a first insulating layer and a second insulating layer, in which wiring layers are respectively provided on the upper and the lower surfaces; and; a core layer provided between the first insulating layer and the second insulating layer. The first insulating layer and the second insulating layer are constituted by different materials from each other.

10 Claims, 14 Drawing Sheets

400

MULTILAYER WIRING SUBSTRATE, SEMICONDUCTOR PACKAGE, AND METHOD OF MANUFACTURING SEMICONDUCTOR PACKAGE

This application is based on Japanese patent application NO. 2008-097815, the content of which is incorporated hereinto by reference.

BACKGROUND

1. Technical Field

The present invention relates to a multilayer wiring substrate, a semiconductor package, and a method of manufacturing the semiconductor package.

2. Related Art

Recently, a multilayer wiring substrate with a multilayered wiring layer has been used along with miniaturization of electronic parts. The multilayer wiring substrate is formed by sticking insulating layers which have wiring layers on the upper and the lower surfaces, on and under a core layer which is constituted by an insulating material and is located between the insulating layers.

According to the configuration described in Japanese Laid-open patent publication NO. H10-294560, the thickness of an insulating layer on which a higher ratio of the wiring portions of the wiring layers is formed is increased in comparison with those of other layers in order to control the warp of a substrate which is caused by density differences among wiring portions on a wiring layer.

In Japanese Laid-open patent publication NO. 2004-281924, there has been described a configuration in which two insulating layers with different physical properties are alternately laminated in order to reduce contraction along the surface to reduce deformations.

In Japanese Laid-open patent publication 2005-38906, there has been described a coreless thin-type wiring substrate with a thickness of equal to or less than 0.5 mm. In the board, a warp amount is made below a predetermined value or less by setting a stress of an insulating material in the outermost layer within a predetermined range.

By the way, a semiconductor package is formed by installing a semiconductor chip on a substrate, and by sealing the chip with a sealing resin. As the thickness of a sealing resin is usually very thick in comparison with that of a substrate and that of a semiconductor chip, the warp of the semiconductor package can be controlled by controlling the sealing resin. In such the case, the warp of the semiconductor package was not a problem. However, the thickness of the sealing resin has become thinner along with recent finer processing. Thereby, there has been caused a problem that, even if there is no warp in the substrate, there is caused a warp in the semiconductor package according to characteristics of the sealing resin, the semiconductor chip, and the substrate, when these components are built into a semiconductor package.

As described later, the semiconductor package is installed into a motherboard through a solder ball or the like, or is laminated on another semiconductor packages. Such building is usually performed under a high temperature. At that time, the building cannot be sometimes performed because the contraction rates and the extension rates of the components are largely different from each other according to characteristics of components and a warp is caused in the semiconductor package.

However, only reduction in the warp of a substrate has received attention, and the warp of a semiconductor package has not been able to be reduced in techniques described in Japanese Laid-open patent publication NOs. H10-294560, 2004-281924, 2005-38906.

SUMMARY

In one embodiment, there is provided a semiconductor package including:
a multilayer wiring substrate;
a semiconductor chip installed on the multilayer wiring substrate; and
a sealing resin which seals the semiconductor chip, wherein the multilayer wiring substrate includes:
a first insulating layer including wiring layers provided on the upper and the lower surfaces thereof;
a second insulating layer including wiring layers provided on the upper and the lower surfaces thereof; and
a core layer provided between the first insulating layer and the second insulating layer,
wherein the first insulating layer is constituted by a material different from that of the second insulating layer.

In another embodiment, there is provided a multilayer wiring substrate, including:
a first insulating layer including wiring layers provided on the upper and the lower surfaces thereof;
a second insulating layer including wiring layers provided on the upper and the lower surfaces thereof; and
a core layer provided between the first insulating layer and the second insulating layer,
wherein the first insulating layer is constituted by a material different from that of the second insulating layer.

In another embodiment invention, there is provided a method of manufacturing a semiconductor package including a multilayer wiring substrate including two insulating layers each including wiring layers respectively provided on the upper and lower surfaces thereof and a core layer provided between the insulating layers, a semiconductor chip installed on the multilayer wiring substrate, and a sealing resin sealing the semiconductor chip,
the method including constituting the materials of the two insulating layers different from each other such that the multilayer wiring substrate has a warp projecting toward one way at a predetermined temperature when the semiconductor package having a warp projecting toward the other way which is an opposite direction from the one way at the predetermined temperature.

Based on the configuration, the warp of the semiconductor package can be reduced by using a multilayer wiring substrate which has a warp projecting in the direction opposite to that of the semiconductor package.

Moreover, arbitrary combinations of the components, and ones obtained by conversion of the expression of the present invention among methods, devices, or the like are effective as the aspect of the present invention.

According to the present invention, the warp of the semiconductor package can be reduced.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, embodiments of the present invention will be described, using the drawings. Here, same components in all the drawings are denoted by the same reference numbers, and the description will be not be repeated.

The semiconductor package is manufactured according to the following procedures. FIGS. 5A to 5E are cross sectional views showing procedures for manufacturing the semiconductor package.

Figure 5A:
FIGS. 5A to 5E show are cross sectional views illustrating procedures for manufacturing a semiconductor package.
Figure 5B:
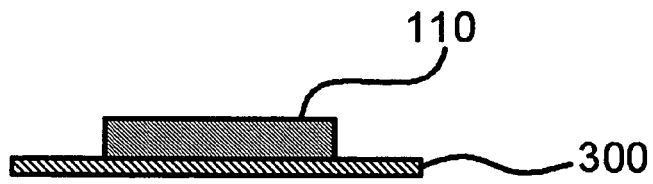
Figure 5C:
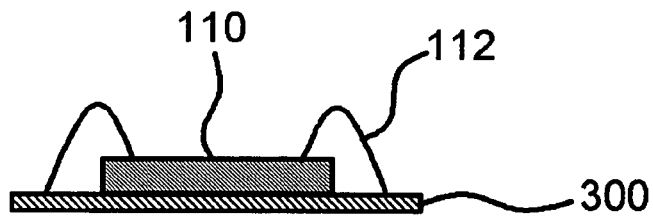
Figure 5D:
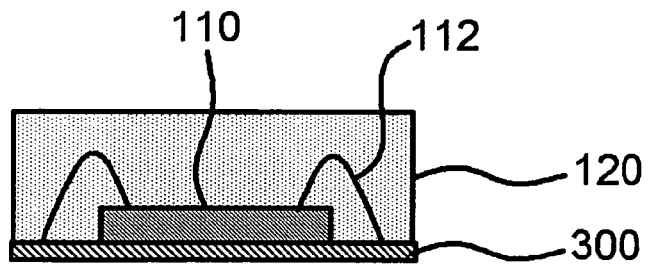
Figure 5E:
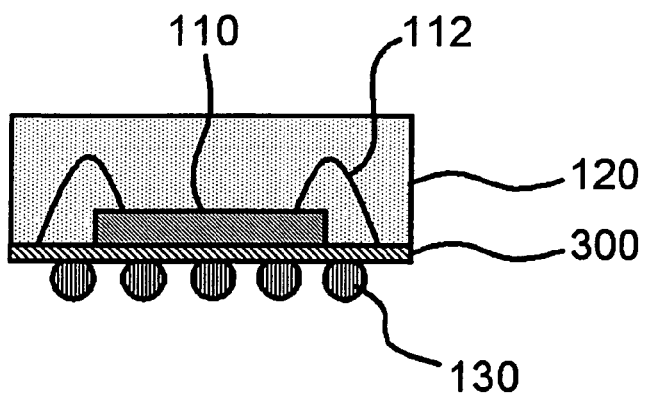

Firstly, a semiconductor chip 110 is installed on a multilayer wiring substrate 300 (FIGS. 5A and 5B). Then, the semiconductor chip 110 and the multilayer wiring substrate 300 are electrically connected by using bonding wires 112 or the like (FIG. 5C). Subsequently, the semiconductor chip 110 and the bonding wire 112 are sealed, using a sealing resin 120 (FIG. 5D). The sealing resin 120 may include, for example, an epoxy resin. Thereby, there is formed a semiconductor package 400. Thereafter, a solder ball 130 is formed on the back side of the multilayer wiring substrate 300, and is installed on a mother board or the like (not shown in the drawings) (FIG. 5E).

Figure 6A:
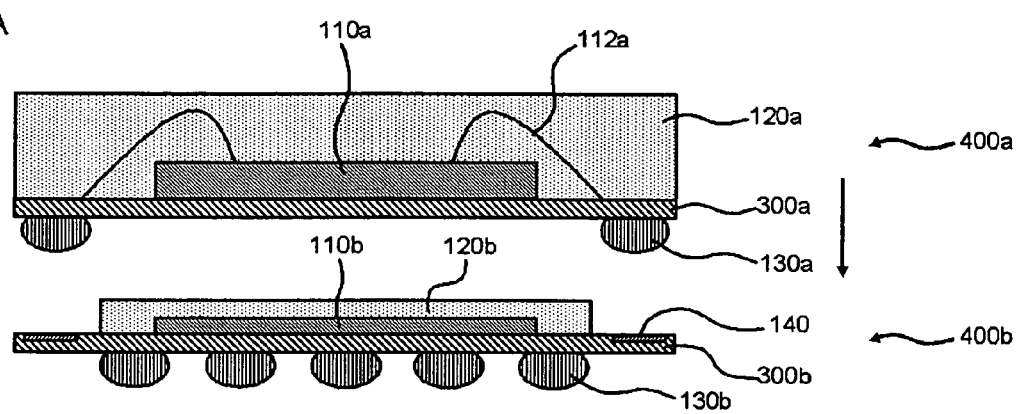
FIGS. 6A and 6B are cross sectional views illustrating procedures for manufacturing a semiconductor package.
Figure 6B:
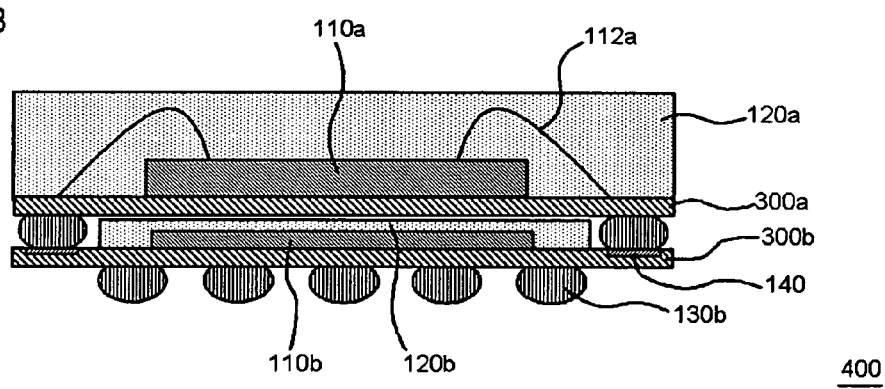

Moreover, a package-on-package (POP) type structure may be obtained by further installing the semiconductor package formed above on another semiconductor package. FIGS. 6A and 6B include views showing processes by which the semiconductor package 400 with the POP structure is formed. Here, a first semiconductor package 400a and a second semiconductor package 400b are respectively formed.

The first semiconductor package 400a includes: a multilayer wiring substrate 300a; a first semiconductor chip 110a installed on the multilayer wiring substrate 300a; bonding wires 112a which electrically connect the first semiconductor chip 110a and the multilayer wiring substrate 300a; a sealing resin 120a which seals the first semiconductor chip 110a and the bonding wires 112a; and a solder ball 130a installed on the back side of the multilayer wiring substrate 300a.

The second semiconductor package 400b includes: a multilayer wiring substrate 300b; a second semiconductor chip 110b installed on the multilayer wiring substrate 300b; a sealing resin 120b which seals the second semiconductor chip 110b; a land 140 installed on the surface of the multilayer wiring substrate 300b; and a solder ball 130b installed on the back side of the multilayer wiring substrate 300b.

As shown in FIG. 6B, electric connection between the first semiconductor package 400a and the second semiconductor package 400b is made by electric connection between the solder ball 130a in the first semiconductor package 400a and the land 140 in the second semiconductor package 400b to form the semiconductor package 400 with the package on package structure.

Figure 7A:
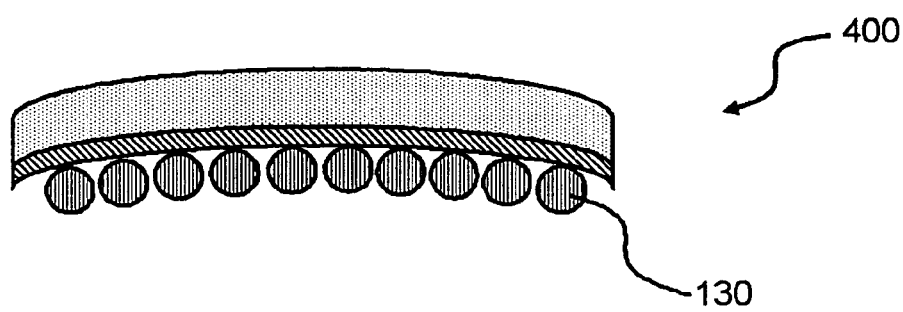
FIGS. 7A and 7B are schematic views of a state in which a warp is caused in a semiconductor package.
Figure 7B:
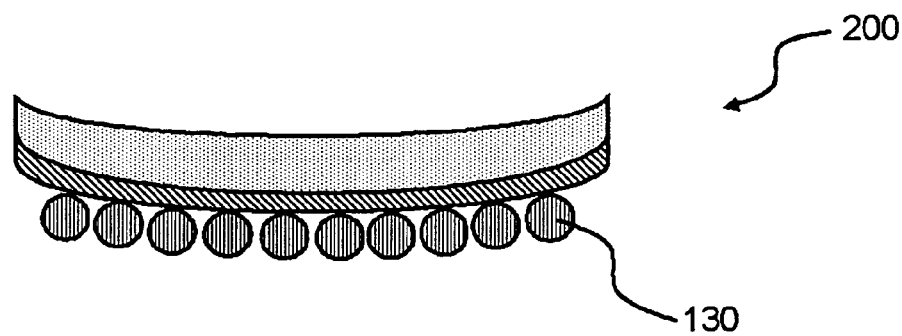

However, the connection by the solder ball when the semiconductor package 400 is installed on the mother board or the like, or when the semiconductor packages are accumulated one another is executed at a high temperature, for example, at about 250° C. Thereby, a warp might be caused in the semiconductor package 400 by the heat. As shown in FIGS. 7A and 7B, when the warp is caused in the semiconductor package 400, it becomes impossible to install the semiconductor package 400 on the mother board or the like. FIG. 7A shows a shape obtained when the semiconductor package 400 projects upwardly, and FIG. 7B shows a shape obtained when the package 400 projects downwardly.

Moreover, even when the semiconductor package 400 with the package on package structure is formed, it becomes impossible to accumulate the first semiconductor package 400a and the second semiconductor package 400b if the package 400a and the package 400b have warps.

Figure 8A:
FIGS. 8A to 8C are views showing one example of a configuration of a substrate provided with an insulating layer having the same material on and under a core.
Figure 8B:
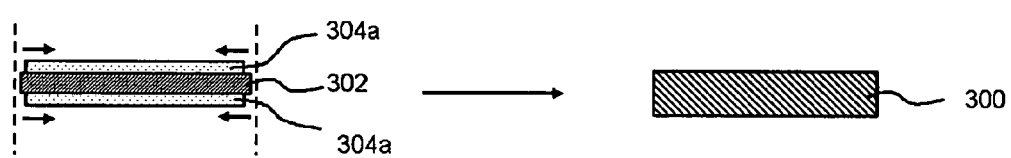
Figure 8C:

FIGS. 8A to 8C are views showing one example of the configuration of the multilayer wiring substrate 300, in which there are provided insulating layers, which are constituted by the same material, on the upper and lower surfaces of a core layer 302. In FIGS. 8A to 8C, there are provided two insulating layers 304a constituted by the same material, having almost the same film thickness, on the upper and lower surfaces of the core layer 302.

FIG. 8A shows the multilayer wiring substrate 300 at about a high temperature at which the substrate 300 is in a stress-free state. Here, the core layer 302 and the insulating layers 304a have almost the same width. At this time, the multilayer wiring substrate 300 has an almost flat shape.

Subsequently, for example, when the multilayer wiring substrate 300 is in a state that the temperature is at an atmospheric temperature lower than that of the state shown in FIG. 8A, the core layer 302 and the insulating layers 304a thereon and thereunder respectively contract. Here, it is assumed that the insulating layers 304a have larger contraction rate than that of the core layer 302. The state under such the assumption is shown in FIG. 8B. At this time, a contracting force is exerted on the core layer 302 by the insulating layers 304a provided on the upper and the lower surfaces of the core layer

302. However, the multilayer wiring substrate 300 has an almost flat shape because the same forces are exerted on the upper and the lower surfaces of the core layer 302.

Furthermore, for example, when the multilayer wiring substrate 300 is in a state that the temperature is higher than that of the state shown in FIG. 8A, the core layer 302 and the insulating layer 304*a* thereon and thereunder respectively extend. Here, it is assumed that the insulating layers 304*a* have larger extension rate than that of the core layer 302. The state under such the assumption is shown in FIG. 8C. At this time, an extending force is exerted on the core layer 302 by the insulating layers 304*a* provided on the upper and lower surfaces of the core layer 302. However, the multilayer wiring substrate 300 has an approximately flat shape because the same forces are exerted on the upper and the lower surfaces of the core layer 302.

Figure 9A:
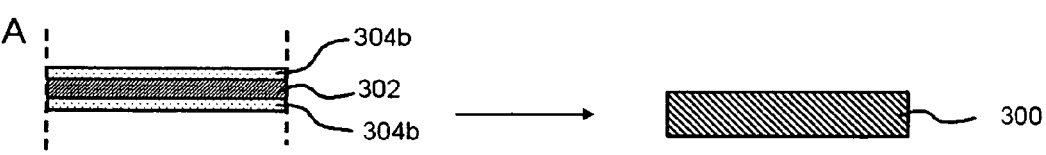
FIGS. 9A to 9C are views showing another example of a configuration of a substrate provided with an insulating layer having the same material on and under the core.
Figure 9B:
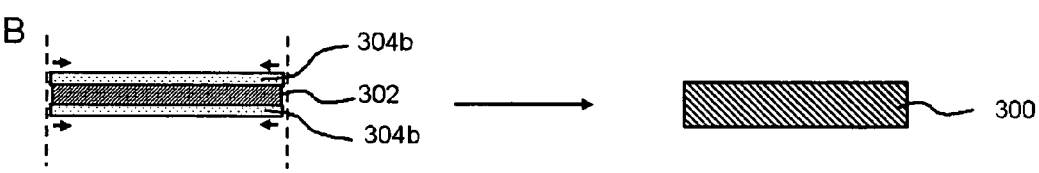
Figure 9C:
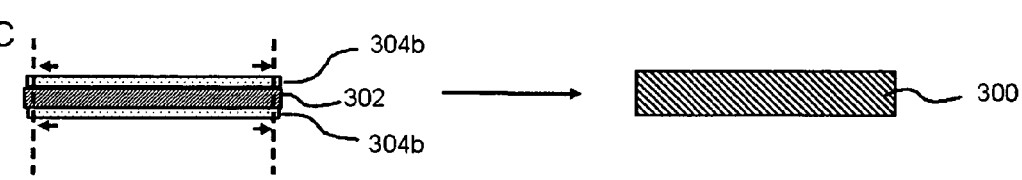

FIGS. 9A to 9C are views showing another example of the configuration of the multilayer wiring substrate 300, in which there are provided insulating layers, which are constituted by the same material, on the upper and lower surfaces of a core layer 302. In FIGS. 9A to 9C, there are provided two insulating layers 304*b* constituted by the same material, having almost the same film thickness, on the upper and lower surfaces of the core layer 302.

FIG. 9A shows the multilayer wiring substrate 300 at about a high temperature at which the substrate 300 is in a stress-free state. Here, the core layer 302 and the insulating layers 304*a* have almost the same width. At this time, the multilayer wiring substrate 300 has an almost flat shape.

Subsequently, for example, when the multilayer wiring substrate 300 is in a state that the temperature is at an atmospheric temperature lower than that of the state shown in FIG. 9A, the core layer 302 and the insulating layers 304*a* thereon and thereunder respectively contract. Here, it is assumed that the insulating layers 304*a* have smaller contraction rate than that of the core layer 302. The state under such the assumption is shown in FIG. 9B. At this time, an extending force is exerted on the core layer 302 by the insulating layers 304*b* provided on the upper and the lower surfaces of the core layer 302. However, the multilayer wiring substrate 300 has an almost flat shape because the same forces are exerted on the upper and the lower surfaces of the core layer 302.

Furthermore, for example, when the multilayer wiring substrate 300 is in a state that the temperature is higher than that of the state shown in FIG. 9A, the core layer 302 and the insulating layer 304*a* thereon and thereunder respectively extend. Here, it is assumed that the insulating layers 304*b* have smaller extension rate than that of the core layer 302. The state under such the assumption is shown in FIG. 9C. At this time, a contracting force is exerted on the core layer 302 by the insulating layers 304*b* provided on the upper and lower surfaces of the core layer 302. However, the multilayer wiring substrate 300 has an approximately flat shape because the same forces are exerted on the upper and the lower surfaces of the core layer 302.

As shown in FIGS. 8A to 8C and FIGS. 9A to 9C, the substrate having insulating layers provided on and under the core layer 302 has almost the flat shape even in any states.

Figure 10A:
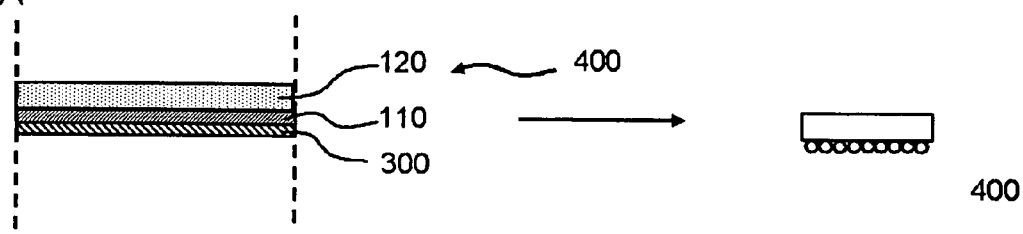
FIGS. 10A to 10C are schematic views of one example of a configuration of a semiconductor package on which a semiconductor chip and a sealing resin are accumulated on the substrate shown in FIGS. 8A to 8C or FIGS. 9A to 9C.
Figure 10B:
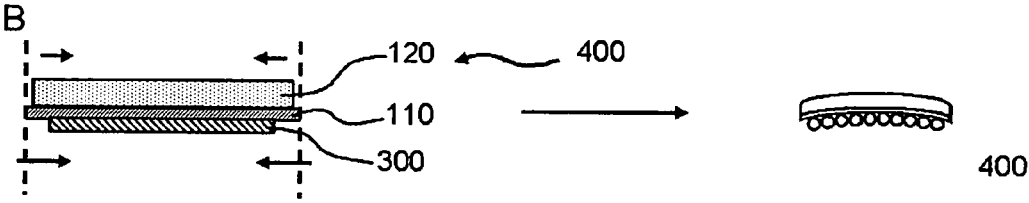
Figure 10C:
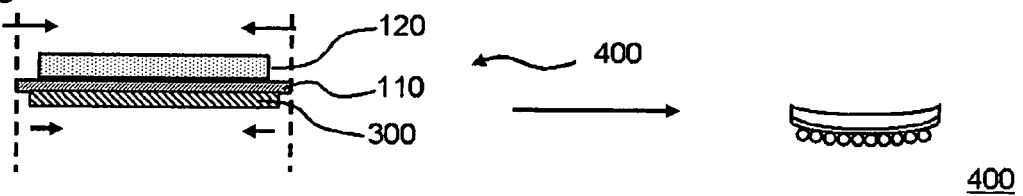

Then, there will be described a configuration of a semiconductor package using the multilayer wiring substrate 300. FIGS. 10A to 10C are diagrammatic views showing one example of the configuration of the semiconductor package 400 in which the semiconductor chip 110 and the sealing resin 120 are accumulated on the multilayer wiring substrate 300.

FIG. 10A shows the semiconductor package 400 at about a high temperature at which the semiconductor package 400 is in a stress-free state. At this time, the substrate package 400 has almost the flat shape.

Subsequently, for example, when the semiconductor package 400 is in a state that the temperature is at an atmospheric temperature lower than that of the state shown in FIG. 10A, the multilayer wiring substrate 300, the semiconductor chip 110, and the sealing resin 120 respectively contract. Here, it is assumed, for example, that the multilayer wiring substrate 300 has a larger contraction rate than that of the sealing resin 120. The state under such the assumption is shown in FIG. 10B. At this time, a stronger contracting force is exerted on the semiconductor package 400 on the side of the multilayer wiring substrate 300. Therefore, the semiconductor package 400 has an upwardly projecting warp.

On the other hand, it is assumed at this time that, for example, the sealing resin 120 has a contraction rate larger than that of the multilayer wiring substrate 300. The state under such the assumption is shown in FIG. 10C. At this time, a stronger contracting force is exerted on the semiconductor package 400 on the side of the sealing resin 120. Therefore, the semiconductor package 400 has a downwardly projecting warp.

Figure 11A:
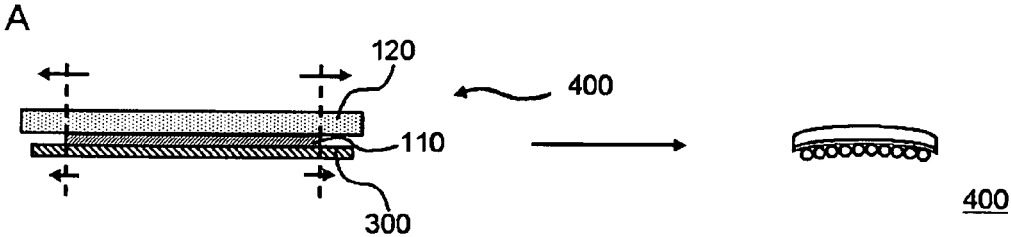
FIGS. 11A and 11B are schematic views showing one example of the configuration of a semiconductor package in which a semiconductor chip and a sealing resin are accumulated on the substrate shown in FIGS. 8A to 8C, or FIGS. 9A to 9C.

Furthermore, for example, when the semiconductor package 400 is in a state that the temperature is higher than that of the state shown in FIG. 10A, the multilayer wiring substrate 300, the semiconductor chip 110, and the sealing resin 120 respectively extend. Here, it is assumed that the extension rate of the sealing resin 120 is larger than that of the multilayer wiring substrate 300. The state under such the assumption is shown in FIG. 11A. At this time, a stronger contracting force is exerted on the semiconductor package 400 on the side of the multilayer wiring substrate 300. Therefore, the semiconductor package 400 has an upwardly projecting warp.

Figure 11B:
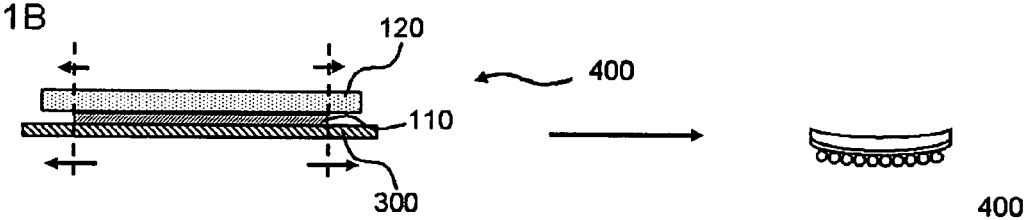

On the other hand, it is assumed at this time that, for example, the multilayer wiring substrate 300 has a larger extension rate than that of the sealing resin 120. The state under such the assumption is shown in FIG. 11B. At this time, a stronger contraction force is exerted on the semiconductor package 400 on the side of the sealing resin 120. Therefore, the semiconductor package 400 has a downwardly projecting warp.

As described above, in a configuration in which an insulating layers constituted by the same material are provided on the upper and the lower surfaces of the core layer 302 in the multilayer wiring substrate 300, the warp of the semiconductor package 400 cannot be reduced, for example, at a high temperature even when a material of the insulating layers on the multilayer wiring substrate 300 is variously changed. In order to reduce such a warp, techniques in which the film thickness or the like of the multilayer wiring substrate 300 and the sealing resin 120 are adjusted, for example, according to the warp state of the semiconductor package 400. However, on the other hand, it is desirable to have the film thickness of each layer as thin as possible for finer processing.

Figure 14A:
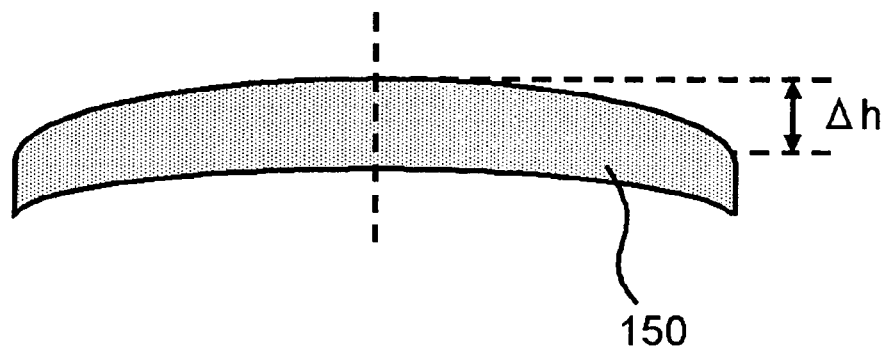
FIGS. 14A and 14B are views showing a warp state.
Figure 14B:
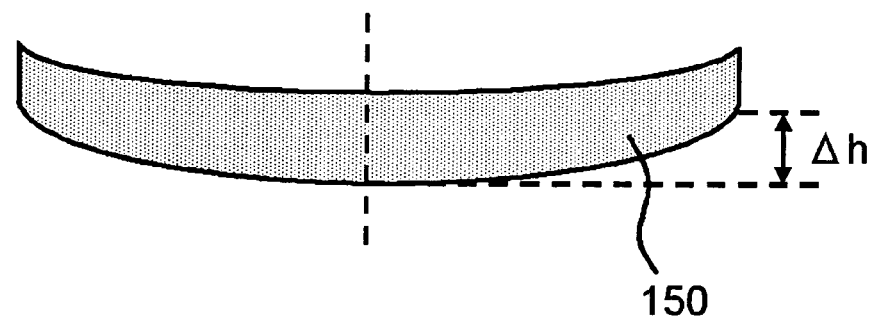

Then, in the present embodiment, when a semiconductor package is formed as usual, and there is generated a warp which is convexed upwardly or downwardly, in the semiconductor package at a desired and predetermined temperature, two insulating layers in the multilayer wiring substrate are configured to have a different material respectively in such a way that there is generated a warp in the multilayer wiring substrate on the other side of a warp generated in the semiconductor package at the predetermined temperature. Thereby, the warp of the semiconductor package can be reduced under a desired and predetermined temperature condition. Here, the warp means a difference Δh in height between the projected bottom surface in the central portion of an object 150 such as substrate and a package, and the bottom surface of the end portion as shown in FIGS. 14A and 14B.

Figure 1A:
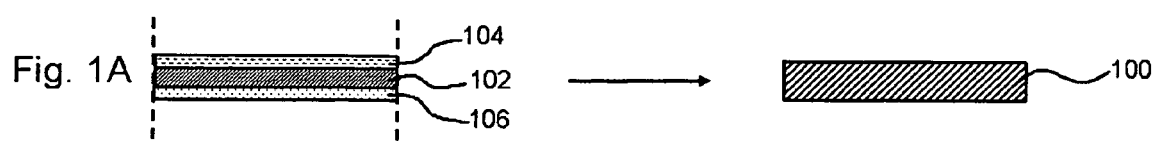
FIGS. 1A to 1C are cross sectional views showing a configuration of a substrate according to embodiments of the present invention.
Figure 1B:
Figure 1C:
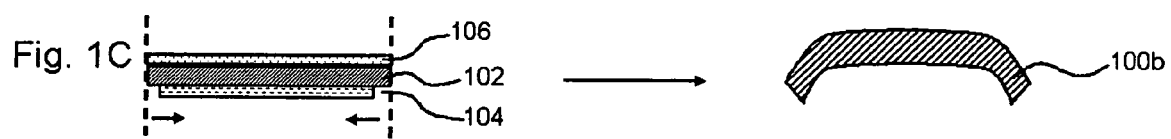

FIGS. 1A to 1C are cross sectional views showing the configuration of the multilayer wiring substrate 100 in the present embodiment.

In the present embodiment, the multilayer wiring substrate 100 includes: a core layer 102, a first insulating layer 104 and a second insulating layer 106 which are provided on the upper and the lower surfaces of the core layer 102 respectively. Here, the first insulating layer 104 and the second insulating layer 106 are constituted by different materials from each other, respectively.

The first insulating layer 104 and the second insulating layer 106 may be formed of, for example, woven glass fabrics and resins. The first insulating layer 104 may be constituted by various materials with different physical property values such as a linear expansion coefficient, or a glass transition temperature, for example, by changing the material of the glass fabric, increasing the including rate of the glass fabrics in the resin layer increasing the sheet number of the glass fabric to change a ply number, or changing a filler content in the resin. In the present invention, the first insulating layer 104 and the second insulating layer 106 may be formed, for example, in such a way that the linear expansion coefficients are different by 1 ppm/° C. or more. Moreover, the first insulating layer 104 and the second insulating layer 106 may be formed, for example, in such a way that the first insulating layer 104 and the second insulating layer 106 are configured that the glass transition temperatures are different from each other by 5° C. or more. Moreover, the first insulating layer 104 and the second insulating layer 106 may be configured to have almost equal film thickness in the present embodiment.

Furthermore, though not shown here, wiring layers are provided on the upper and the lower surfaces of the first insulating layer 104 and those of the second insulating layer 106, respectively. The difference between existence ratios of wiring of the wiring layer provided on the upper and lower surfaces of the first insulating layer 104 to the plane area of the first insulating layer 104, and existence ratios of wiring of the wiring layer provided on the upper and lower surfaces of the second insulating layer 106 to the plane area of the second insulating layer 106 may be same for example. Here, the existence rate of wiring of the wiring layer to the plane area of the insulating layer means a ratio of the areas of wiring in the plane direction to the area of the insulating layer in the plane direction. The difference between the existence ratios may be equal to or smaller than 20%. The core layer 102 may be formed of, for example, glass fabric and the resin in the similar manner as the insulating layer.

FIG. 1A shows the multilayer wiring substrate 100 at about a high temperature at which the semiconductor package 100 is in a stress-free state. Here, the core layer 102, the first insulating layer 104, and the second insulating layer 106 have almost equal width. At this time, the multilayer wiring substrate 100 has almost the flat shape.

Here, for example, it is assumed that the temperature is at an atmospheric temperature lower than that of the state shown in FIG. 1A and the contraction rate of the first insulating layer 104 is larger than that of the second insulating layer 106. In this case, for example, by arranging the first insulating layer 104 on the core layer 102, and by arranging the second insulating layer 106 under the core layer 102 as shown in FIG. 1B, there can be obtained a multilayer wiring substrate 100a which projects downwardly at an atmospheric temperature. Moreover, for example, by arranging the second insulating layer 106 on the core layer 102, and the first insulating layer 104 under the core layer 102, there can be obtained a multilayer wiring substrate 100b which projects upwardly at an atmospheric temperature, as shown in FIG. 1C.

Figure 2A:
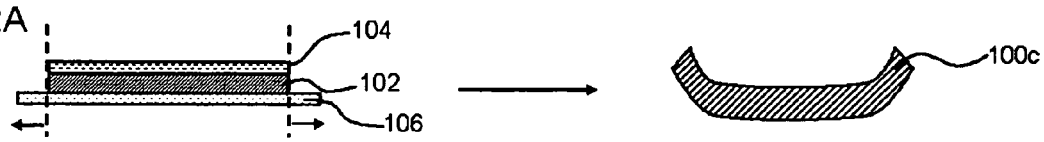
FIGS. 2A and 2B are cross sectional views showing a configuration of a substrate according to an embodiment of the present invention.
Figure 2B:
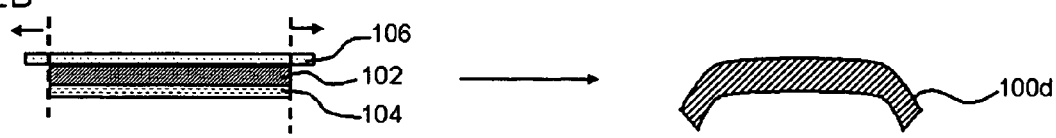

Similarly, for example, it is assumed that the temperatures is increased more than a state shown in FIG. 1A and the extension rate of the second insulating layer 106 is larger than that of the first insulating layer 104. In this case, by arranging the first insulating layer 104 on the core low layer 102, and by arranging the second insulating layer 106 under the core layer 102, there can be obtained a multilayer wiring substrate 100c which projects downwardly at the high temperature, as shown in FIG. 2A. Moreover, for example, by arranging the second insulating layer 106 on the core layer 102, and by arranging the first insulating layer 104 under the core 102, there can be obtained a multilayer wiring substrate 100d which projects upwardly at the high temperature, as shown in FIG. 2B.

Then, the configurations of a semiconductor package using from the multilayer wiring substrate 100a to the multilayer wiring substrate 100d as described above. Hereinafter, a multilayer wiring substrate 100 properly represents from the multilayer wiring substrate 100a to the multilayer wiring substrate 100d.

Figure 3A:
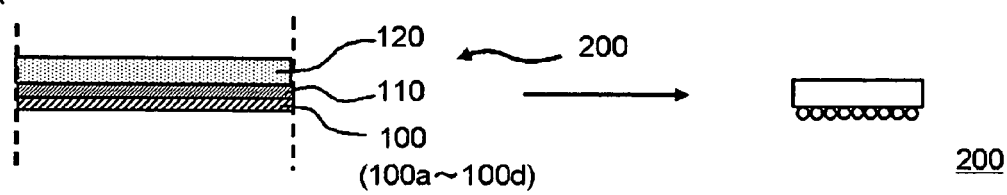
FIGS. 3A to 3C are schematic views of an example of a configuration of a semiconductor package in which a semiconductor chip and a sealing resin are accumulated on a substrate.
Figure 3B:
Figure 3C:

FIGS. 3A to 3C are schematic views showing one example the configuration of a semiconductor package 200 in which a semiconductor chip 110 is installed on a multilayer wiring substrate 100 and is sealed by a sealing resin 120. The semiconductor package 200 may be manufactured according to the procedure similar to that of the semiconductor package 400 which has been described, referring to FIGS. 5A to 5E. Moreover, the thickness of the resin of the sealing resin 120 from the upper surface of the multilayer wiring substrate 100 to the upper surface of the sealing resin 120 may be 0.80 mm or less, for example.

Here, a manufacturing procedure of the package in the present embodiment includes a step of constituting the materials of the two insulating layers provided at the upper side and the lower side of the core layer 102 different from each other such that the multilayer wiring substrate 100 has a warp projecting toward one way at a predetermined temperature when the semiconductor package having a warp projecting toward the other way which is an opposite direction from the one way at the predetermined temperature.

FIG. 3A shows the semiconductor package 200 at a high temperature at which the semiconductor package 200 is in a stress-free state. At this time, the semiconductor package 200 has almost the flat shape.

Subsequently, for example, when the semiconductor package 200 is in a state that the temperature is at an atmospheric temperature lower than that of the state shown in FIG. 3A, the multilayer wiring substrate 100, the semiconductor chip 110, and the sealing resin 120 respectively contract. Here, it is assumed, for example, that the contraction rate of the multilayer wiring substrate 100 is larger than that of sealing resin 120. The above state is shown in FIG. 3B. At this time, a stronger contracting force is exerted on the semiconductor package 200 on the side of the multilayer wiring substrate 100. Therefore, a force to form an upwardly projected warp in the semiconductor package 200 is generated. Here, when the multilayer wiring substrate 300 in which no warp is formed is used, an upwardly projected warp is formed in the semiconductor package 400, as shown in FIG. 10B. On the other hand, when the multilayer wiring substrate 100a, as shown in FIG. 1B, in which a downwardly projected warp is formed is used as the multilayer wiring substrate 100, the whole semiconductor package 200 can be made flat.

On the other hand, it is assumed that, at this time, for example, the contraction rate of the sealing resin 120 is larger than that of the multilayer wiring substrate 100. The above state is shown in FIG. 3C. At this time, a stronger contracting force is exerted on the semiconductor package 200 on the side of the sealing resin 120. Therefore, a force to form a downwardly projected warp in the semiconductor package 200 is generated. Here, when the multilayer wiring substrate 300 in which no warp is formed is used, a downwardly projected warp is formed in the semiconductor package 400 as shown in FIG. 10C. On the other hand, when the multilayer wiring substrate 100b, shown in FIG. 1C, in which an upwardly projected warp is used as the multilayer wiring substrate 100, the whole semiconductor package 200 can be made flat.

Figure 4A:
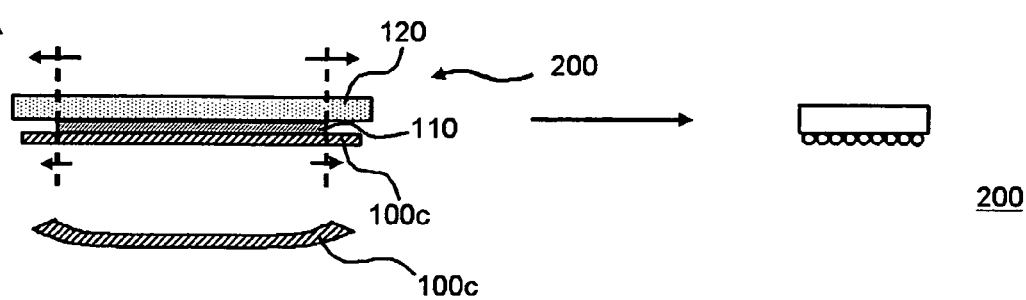
FIGS. 4A and 4B are schematic views of one example of a configuration of a semiconductor package in which a semiconductor chip and a sealing resin are accumulated on a substrate.

Moreover, for example, when the semiconductor package 200 is in a state that the temperature is increased to a higher temperature than that of the state shown in FIG. 3A, the multilayer wiring substrate 100, the semiconductor chip 110, and the sealing resin 120 respectively extends. Here, it is assumed that, for example, the extension rate of the sealing resin 120 is larger than that of the multilayer wiring substrate 100. The above state is shown in FIG. 4A. At this time, a stronger contracting force is exerted on the semiconductor package 200 on the side of the multilayer wiring substrate 100. Therefore, a force to form an upwardly projected warp in the semiconductor package 200 is generated. Here, when the multilayer wiring substrate 300 in which no warp is formed is used, an upwardly projected warp is formed in the semiconductor package 400, as shown in FIG. 11A. On the other hand, when the multilayer wiring substrate 100c, as shown in FIG. 2A, in which a downwardly projected warp is formed is used as the multilayer wiring substrate 100, the whole semiconductor package 200 can be made flat.

Figure 4B:
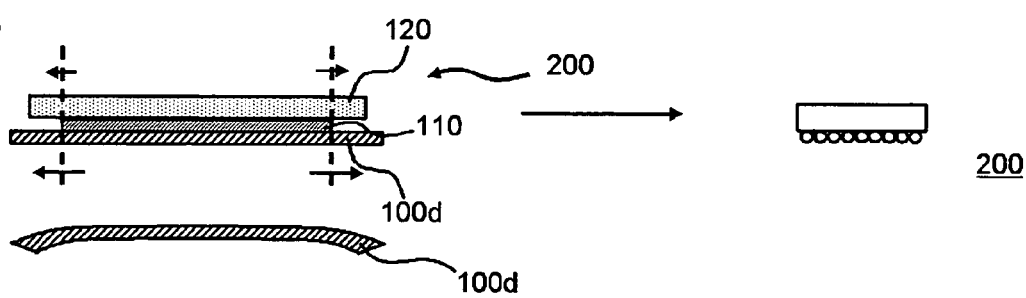

On the other hand, it is assumed, at this time that, for example, the extension rate of the multilayer wiring substrate 100 is larger than that of the sealing resin 120. The above state is shown in FIG. 4B. At this time, a stronger contracting force is exerted on the semiconductor package 200 on the side of the sealing resin 120. Therefore, a force to form a downwardly projected warp in the semiconductor package 200 is generated. Here, when the multilayer wiring substrate 300 in which no warp is formed is used, a downwardly projected warp is formed in the semiconductor package 400 as shown in FIG. 11B. On the other hand, when the multilayer wiring substrate 100d, shown in FIG. 2B, in which an upwardly projected warp is used as the multilayer wiring substrate 100, the whole semiconductor package 200 can be made flat.

The combination of the multilayer wiring substrates to each case may be determined by feeding-back the measured value as follows, for example. Firstly, the semiconductor package 400 with the multilayer wiring substrate 300 is actually formed. Then, the warp formed in the semiconductor package 400 in the predetermined condition is measured. Then, based on the measured value, appropriate materials are selected. Alternatively, the simulation may be performed and the simulation results may be used to determine the combination of the multilayer wiring substrates.

As described above, by providing the first insulating layer 104 and the second insulating layer 106 constituted by different materials on and under the core layer 102, there are prepared various kinds of the multilayer wiring substrates 100 having an upwardly-, or downwardly-projected warp under various kinds of temperature conditions. Thereby, the warp in the semiconductor package 200 can be reduced by using the multilayer wiring substrate 100 which compensates the warp according to the warp condition of the target semiconductor package.

(Simulation Results)

The simulations were conducted to see the generation of the warp in a semiconductor package similar to the semiconductor package 200, or the semiconductor package 400 in accordance with the temperatures. The results are shown in FIGS. 12A and 12B, and FIGS. 13A and 13B.

EXAMPLE 1

Figure 12A:
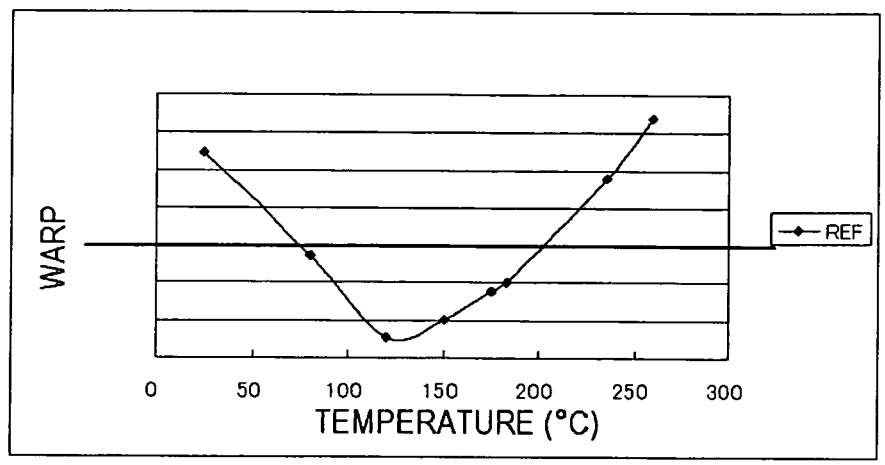
FIGS. 12A and 12B are views showing simulation results.

As is explained with referring to FIGS. 8A to 8C and FIGS. 9A to 9C, it has been assumed a semiconductor package using the multilayer wiring substrate 300 in which insulating layers constituted by the same material on the upper and lower surfaces of the core layer 302. The above simulation results are shown in FIG. 12A.

EXAMPLE 2

Figure 12B:
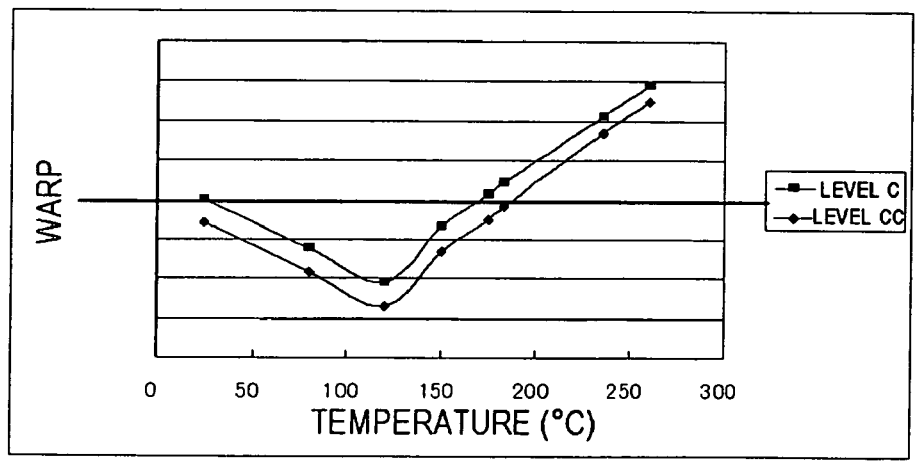

As is explained with referring to FIGS. 8A to 8C and FIGS. 9A to 9C, it has been assumed a semiconductor package using the multilayer wiring substrate 300 in which insulating layers constituted by the same material on the upper and lower surfaces of the core layer 302. Here, it has been assumed that a resin material with a lower linear expansion coefficient than that of the insulating layer used in the example 1 is used. The above simulation results are shown in FIG. 12B.

EXAMPLE 3

Figure 13A:
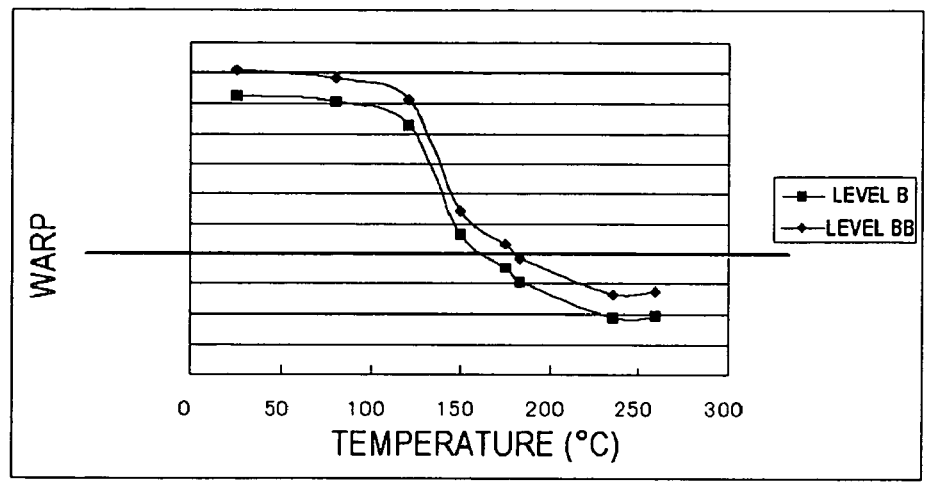
FIGS. 13A and 13B are views showing a view of simulation results.

As is explained with referring to FIGS. 1A to 1C, and FIGS. 2A and 2B, it has been assumed a semiconductor package using the multilayer wiring substrates 100 including insulating layers constituted by different materials from each other on the upper and the lower surfaces of the core layer 102. Here, it has been assumed that the lower insulating layer under the core layer 102 is a similar one to that of the example 1, and the upper insulating layer has a lower linear expansion coefficient than that of the lower insulating layer. FIG. 13A shows simulation results based on the above simulation results.

EXAMPLE 4

Figure 13B:
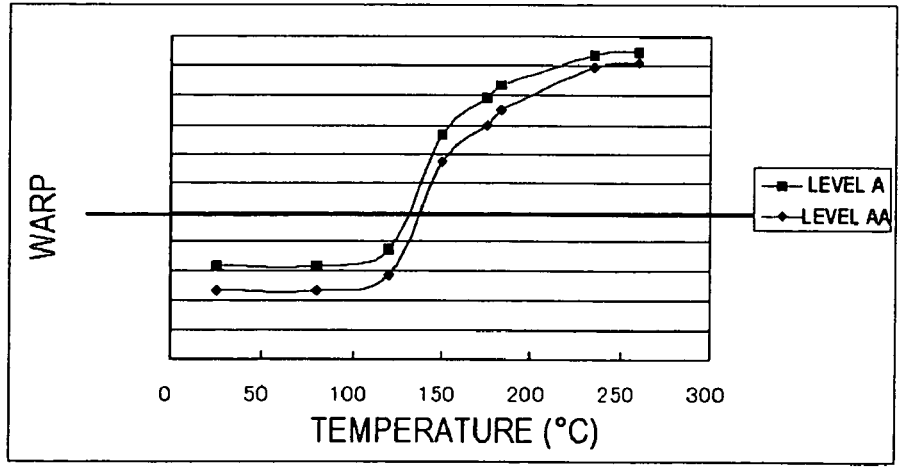

As is explained referring to FIGS. 1A to 1C and FIGS. 2A and 2B, it has been assumed a semiconductor package using a multilayer wiring substrates 100 including insulating layers constituted by different materials from each other on the upper and the lower surfaces of the core layer 102. Here, it has been assumed that the upper insulating layer over the core layer 102 is a similar one to that of the example 1, and the lower insulating layer has a different glass fabric material, a different resin material, and a different ply number from those of the upper insulating layer. Simulation results at this time are shown in FIG. 13B.

In the drawings, the upper side of the vertical axis shows an upwardly projected warp degree, and the lower side shows a downwardly projected warp degree. In the example 1 and the example 2, upwardly projected warps are formed among the low-temperature side and the high-temperature side from a boundary temperature as a stress-free point. In these example, the same type of the warps are formed among the temperatures including the low-temperature side and the high-temperature side.

On the other hand, under conditions shown in the example 3, the warp can be reduced at a high temperature of about 250° C. The warp is reduced to 150 μm or less at about 250° C. Moreover, under conditions shown in the example 4, the warp at a temperature of about 50° C. may be reduced, and it was possible to obtain a warp with a dimension of 150 μm or less at measurements at about 50° C. In the example 3 and the example 4, a warp at a desired temperature can be reduced by properly designing of a material.

As described above, embodiments of the present invention have been described, referring to the drawings. But, the above ones are illustrations of the present invention, and various kinds of configurations other than the above can be adopted.

It is apparent that the present invention is not limited to the above embodiments, and may be modified and changed without departing from the scope and spirit of the invention.

What is claimed is:

1. A semiconductor package comprising:
   a multilayer wiring substrate;
   a semiconductor chip installed on said multilayer wiring substrate; and
   a sealing resin which seals said semiconductor chip, wherein said multilayer wiring substrate includes:
   a first insulating layer including wiring layers provided on the upper and the lower surfaces thereof;
   a second insulating layer including wiring layers provided on the upper and the lower surfaces thereof; and
   a core layer provided between said first insulating layer and said second insulating layer,
   wherein said first insulating layer is constituted by a material different from that of said second insulating layer.

2. The semiconductor package as set forth in claim 1, wherein said first insulating layer has an equal film thickness to that of said second insulating layer.

3. The semiconductor package as set forth in claim 1, wherein a difference between existence ratios of wiring of said wiring layer provided on the upper and lower surfaces of said first insulating layer to the plane area of said first insulating layer, and existence ratios of wiring of said wiring layer provided on the upper and lower surfaces of said second insulating layer to the plane area of said second insulating layer is equal to or smaller than 20%.

4. The semiconductor package as set forth in claim 1, wherein the linear expansion coefficient of said first insulating layer, and that of said second insulating layer are different by 1 ppm/° C. or more.

5. The semiconductor package as set forth in claim 1, wherein said multilayer wiring substrate has a warp at 250°C.

6. A multilayer wiring substrate, including:
   a first insulating layer including wiring layers provided on the upper and the lower surfaces thereof;
   a second insulating layer including wiring layers provided on the upper and the lower surfaces thereof; and
   a core layer provided between said first insulating layer and said second insulating layer,
   wherein said first insulating layer is constituted by a material different from that of said second insulating layer.

7. The multilayer wiring substrate as set forth in claim 6, wherein said first insulating layer has an equal film thickness to that of said second insulating layer.

8. The multilayer wiring substrate as set forth in claim 6, wherein a difference between existence ratios of wiring of said wiring layer provided on the upper and lower surfaces of said first insulating layer to the plane area of said first insulating layer, and existence ratios of wiring of said wiring layer provided on the upper and lower surfaces of said second insulating layer to the plane area of said second insulating layer is equal to or smaller than 20%.

9. The multilayer wiring substrate as set forth in claim 6, wherein the linear expansion coefficient of said first insulating layer and that of said second insulating layer are different by 1 ppm/° C. or more.

10. The multilayer wiring substrate as set forth in claim 6, having a warp at 250° C.

* * * * *